United States Patent [19]

Kim et al.

[11] Patent Number: 6,117,692
[45] Date of Patent: Sep. 12, 2000

[54] CALIBRATED METHODS OF FORMING HEMISPHERICAL GRAINED SILICON LAYERS

[76] Inventors: Young-sun Kim, San 24, Nongseo-ri, Kiheung-eub, Yongin-city, Kyungki-do; Young-wook Park, B-201, Saehan Villa, 37-42, Jeongja-dong, Jangan-gu, Suwon-city, Kyungki-do, both of Rep. of Korea

[21] Appl. No.: 09/007,879

[22] Filed: Jan. 14, 1998

[30] Foreign Application Priority Data

Jan. 14, 1997 [KR] Rep. of Korea .......................... 97-760
Dec. 30, 1997 [KR] Rep. of Korea ...................... 97-77776

[51] Int. Cl.[7] .................................................. G01R 31/26
[52] U.S. Cl. .............................. 438/14; 438/398; 438/665
[58] Field of Search .............................. 438/14, 255, 398, 438/488, 665, 964

[56] References Cited

U.S. PATENT DOCUMENTS

| | | | |
|---|---|---|---|
| 5,234,862 | 8/1993 | Aketagawa et al. | 438/488 |
| 5,305,417 | 4/1994 | Najm et al. | 392/418 |
| 5,315,092 | 5/1994 | Takahashi et al. | 219/497 |
| 5,346,853 | 9/1994 | Guha et al. | 438/97 |
| 5,366,917 | 11/1994 | Watanabe et al. | 438/398 |

(List continued on next page.)

FOREIGN PATENT DOCUMENTS

03291915 A 12/1991 Japan .
4-286151 10/1992 Japan .

OTHER PUBLICATIONS

Notice to Submit Response, *Method of Forming hemispherical grained silicon layers*, Korean Industrial Property Office Application No. 10–1997–0077776 (Feb. 11, 2000).

Translation, Notice to Submit Response, *Method of forming hemispherical grained silicon layers*, Korean Industrial Property Office Application No. 10–1997–0077776 (Feb. 11, 2000).

H. Watanabe et al., Hemispherical Grained Silicon (HSG–Si) Formation On In–Situ Phosphorous Doped Amorphous–Si Using The Seeding Method, Extended Abstracts of the 1992 International Conference on Solid State Devices and Materials, Aug. 26–28, 1992, pp. 422–424.

H. Watanabe et al., An Advanced Fabrication Technology of Hemispherical Grained (HSG) Poly–Si for High Capacitance Storage Electrodes, Extended Abstracts of the 1991 International Conference on Solid State Devices and Materials, Yokohama, 1991, pp. 478–480.

H. Watanabe et al., A New Cylindrica Capacitor Using Hemispherical Grained Si (HSG–Si) for 256Mb DRAMs, IEDM 1992, 1992 IEEE, 10.1.1–10.1.4, pp. 259–262.

*Primary Examiner*—Carl Whitehead, Jr.
*Assistant Examiner*—Jamie L. Davis
*Attorney, Agent, or Firm*—Myers, Bigel, Sibley & Sajovec

[57] ABSTRACT

A method of forming a silicon layer includes the step of calibrating the heater temperature so that a predetermined temperature is maintained when a microelectronic substrate is subsequently heated despite a number of processing runs previously performed. This calibrating step includes loading a test substrate into the reaction chamber, subjecting the test substrate to the predetermined reaction recipe wherein the test substrate is heated according to the predetermined recipe, measuring the temperature of the substrate, and removing the test substrate from the reaction chamber. The heater temperature is then adjusted according to the measured temperature of the test substrate. A microelectronic substrate is then loaded into the reaction chamber, and a hemispherical grained silicon seed layer is formed on the microelectronic substrate according to the predetermined recipe. The hemispherical grained silicon seed layer is annealed to form a hemispherical grained silicon layer according to the predetermined recipe.

5 Claims, 3 Drawing Sheets

U.S. PATENT DOCUMENTS

| | | | |
|---|---|---|---|
| 5,372,962 | 12/1994 | Hirota et al. | 438/398 |
| 5,385,863 | 1/1995 | Tatsumi et al. | 438/398 |
| 5,394,012 | 2/1995 | Kimura | 257/739 |
| 5,405,801 | 4/1995 | Han et al. | 438/386 |
| 5,464,791 | 11/1995 | Hirota | 438/253 |
| 5,486,488 | 1/1996 | Kamiyama | 438/396 |
| 5,543,347 | 8/1996 | Kawano et al. | 438/660 |
| 5,554,557 | 9/1996 | Koh | 438/396 |
| 5,567,637 | 10/1996 | Hirota | 438/593 |
| 5,590,051 | 12/1996 | Yokozawa | 364/496 |
| 5,595,937 | 1/1997 | Mikagi | 438/626 |
| 5,616,511 | 4/1997 | Hirota | 438/396 |
| 5,623,243 | 4/1997 | Watanabe et al. | 257/309 |
| 5,663,090 | 9/1997 | Dennison et al. | 438/398 |
| 5,759,262 | 6/1998 | Weimer et al. | 117/88 |
| 5,821,152 | 10/1998 | Han et al. | 438/398 |
| 5,831,282 | 11/1998 | Nuttall | 257/64 |

CALIBRATED METHODS OF FORMING HEMISPHERICAL GRAINED SILICON LAYERS

FIELD OF THE INVENTION

The present invention relates to the field of microelectronics and more particularly to methods of forming hemispherical grained silicon layers.

BACKGROUND OF THE INVENTION

As integrated circuit devices become more highly integrated and operational voltages decrease, it may be desirable to provide a capacitor having increased capacitance per unit area of the substrate. In particular, it may desirable to provide a memory cell capacitor having increased capacitance per substrate area for a highly integrated dynamic random access memory (DRAM) device. A capacitance can be increased by: (1) forming a capacitor dielectric layer using a material having a relatively high dielectric constant; (2) providing a thin dielectric layer; and (3) increasing the surface area of the capacitor electrodes.

Capacitor electrode surface areas have been increased by increasing an exposed sidewall area of the capacitor storage electrode. In particular, three-dimensional capacitor electrode structures have been developed to increase the electrode surface area. Increasing the exposed sidewall areas of the capacitor electrode, however, may reduce the step coverage for subsequently formed layers. In other words, it may be difficult to form a uniform layer over the three-dimensional electrode structure due to an increased step thereof.

Capacitor electrode surface areas have also been increased by forming a silicon layer having hemispherical grains (HSG) on the lower capacitor electrode. A hemispherical grained silicon layer can be formed using seeding and annealing steps. In particular, an irregular silicon layer (seed layer) of a predetermined thickness is formed on the lower capacitor electrode using silane ($SiH_4$) or disilane ($Si_2H_6$) as a silicon source gas during the seeding step. The irregular silicon layer is then grown to form the hemispherical grained silicon layer. The seeding and annealing steps can be sequentially performed in a single reaction chamber. A relatively small amount of silicon, however, may be deposited on the inner wall of the reaction chamber during the seeding step.

When forming a plurality of hemispherical grained silicon layers using the same reaction chamber over a series of processing runs, however, the silicon deposits on the inner surface of the reaction chamber may combine to form an undesired silicon layer on the inner surface of the reaction chamber. This undesired silicon layer may change the reflectivity of the inner surfaces of the reaction chamber walls thereby lowering substrate temperatures during subsequent processing runs. The lower substrate temperatures may change the hemispherical grained silicon layer profiles thereby reducing the effective area of the capacitor electrode. Accordingly, the surface areas of silicon layers formed in a common reaction chamber during subsequent processing runs may be reduced as the number of processing runs increases. Accordingly, there continues to exist a need in the art for methods of forming hemispherical grained silicon layers whereby a predetermined surface area is maintained despite the number of processing runs performed in the reaction chamber.

SUMMARY OF THE INVENTION

It is therefore an object of the present invention to provide improved methods of forming hemispherical grained silicon layers.

It is another object of the present invention to provide methods of forming hemispherical grained silicon layers having increased uniformity from run to run.

These and other objects are provided according to the present invention by methods of forming silicon layers having hemispherical grains thereon in a reaction chamber including a heater and using a predetermined reaction recipe. The heater temperature is calibrated so that a predetermined temperature is maintained when the microelectronic substrate is subsequently heated despite a number of processing runs previously performed. In particular, the calibrating step includes loading a test substrate into the reaction chamber, subjecting the test substrate to the predetermined reaction recipe wherein the test substrate is heated according to the predetermined recipe, and measuring the temperature of the test substrate. The test substrate is removed from the reaction chamber, and the heater temperature is adjusted according to the measured temperature of the test substrate. The microelectronic substrate is loaded into the reaction chamber, and a hemispherical grained silicon seed layer is formed on the microelectronic substrate according to the predetermined recipe. The hemispherical grained silicon seed layer is then annealed to form a hemispherical grained silicon layer according to the predetermined recipe.

By calibrating the heater temperature, a temperature of the microelectronic substrate during the steps of forming and annealing the hemispherical grained silicon seed layer can be maintained from processing run to processing run thereby increasing uniformity of hemispherical grained silicon layers formed from one processing run to the next. In particular, changes in the processing temperature as a result of silicon accumulations on the inner surfaces of reaction chamber walls can be reduced.

The heater temperature can be adjusted by adjusting a current of the heater in response to a calibration value obtained by comparing the measured temperature of the test substrate with the calibration factor of the heater temperature. The temperature of the substrate can be measured while heating the substrate according to the predetermined recipe. In addition, the temperature of the substrate can be measured while a source gas including silicon is injected into the reaction chamber.

The temperature of the test substrate can be measured using a pyrometer and the test substrate can be a bare semiconductor substrate or wafer. Alternately, the test substrate can include a conductive electrode thereon and the hemispherical grained silicon layer can be formed on the conductive electrode during the calibration step. The calibration step of the present invention is preferably performed periodically. For example, the calibration step can be performed once every 24 hours, once every shift, or once for every predetermined number of processing runs.

According to the methods of the present invention, the uniformity of hemispherical grained silicon layers from processing run to processing run can be increased. Accordingly, the uniformity of the capacitance of capacitors including hemispherical grained silicon layers according to the present invention can be improved. Moreover, the reliability and uniformity of integrated circuit devices including hemispherical grained silicon layers according to the present invention can be improved.

DETAILED DESCRIPTION

Figure 1:
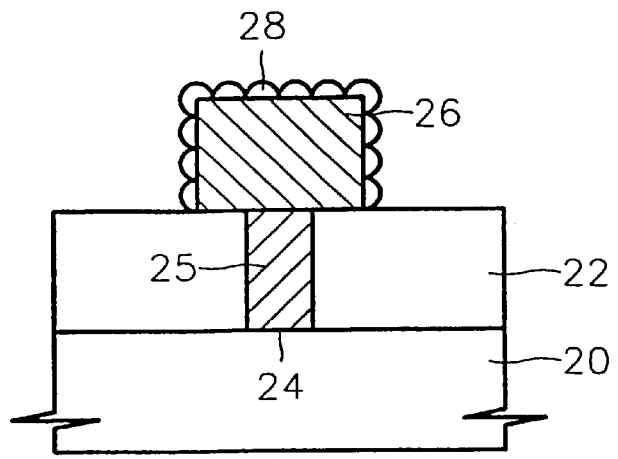
FIG. 1 is a cross-sectional view illustrating a capacitor storage electrode including a hemispherical grained silicon layer formed according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

FIG. 1 is a cross-sectional view illustrating a lower capacitor electrode according to the present invention. In particular, an insulating layer 22 is deposited on a semiconductor substrate 20. The insulating layer 22 is patterned to provide a contact hole 24 therethrough, and a conductive material such as doped polysilicon is formed in the contact hole 24 to provide a contact plug 25. A conductive material such as platinum (Pt) is deposited on the insulating layer 22 and the contact plug 25 to provide a conductive layer which is patterned to form the lower capacitor electrode 26.

In addition, a barrier layer such as TaSiN can be formed between the contact plug 25 and the lower capacitor electrode 26. When including a barrier layer, the lower capacitor electrode layer and the barrier layer can be sequentially patterned to provide the lower capacitor electrode 26 and the barrier layer pattern on the contact plug 25. A hemispherical grained silicon layer 28 is then formed on the lower capacitor electrode 26.

A dielectric layer is then formed on the hemispherical grained silicon layer 28, and a second conductive layer is formed on the dielectric layer to provide a second capacitor electrode. In addition, the step of forming the insulating layer 22 can be preceded by the step of forming a memory cell capacitor on the substrate wherein a source/drain region of the memory cell transistor is exposed by the contact hole 24. Accordingly, the methods of the present invention can be used to provide improved memory cell capacitors for integrated circuit memory devices.

Figure 2:
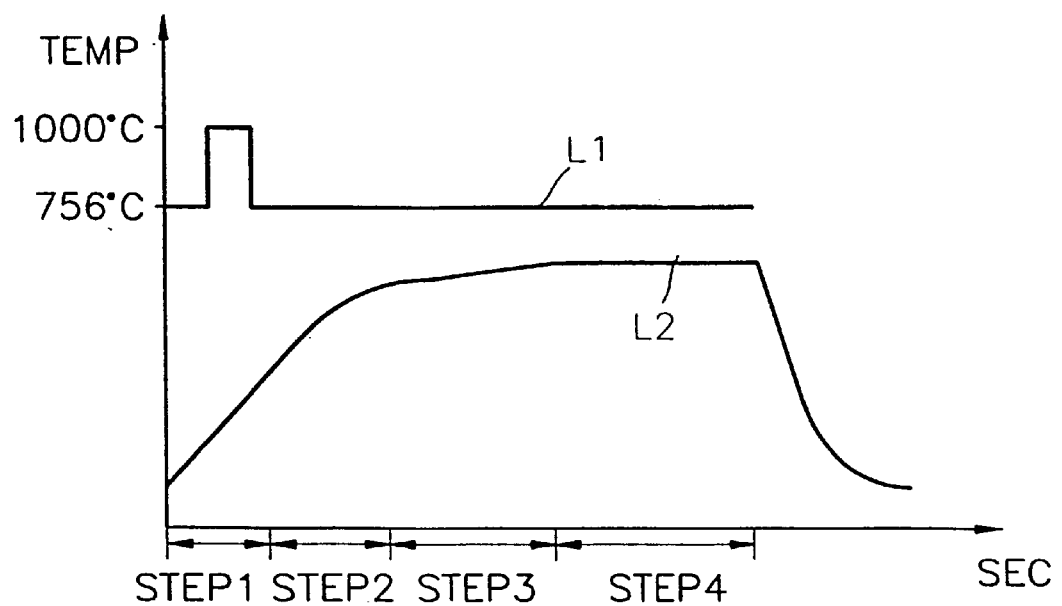
FIG. 2 is a graph illustrating a change of a heater temperature and a substrate temperature during the steps of forming a hemispherical grained silicon layer according to the present invention.

FIG. 2 is a graph illustrating heater and substrate temperatures for the process steps used during the formation of the hemispherical grained silicon layer according to the method of the present invention. In FIG. 2, the abscissa indicates the processing step, and the ordinate indicates the temperature. Moreover, L1 indicates the heater temperature and L2 indicates the substrate temperature.

Figure 3:
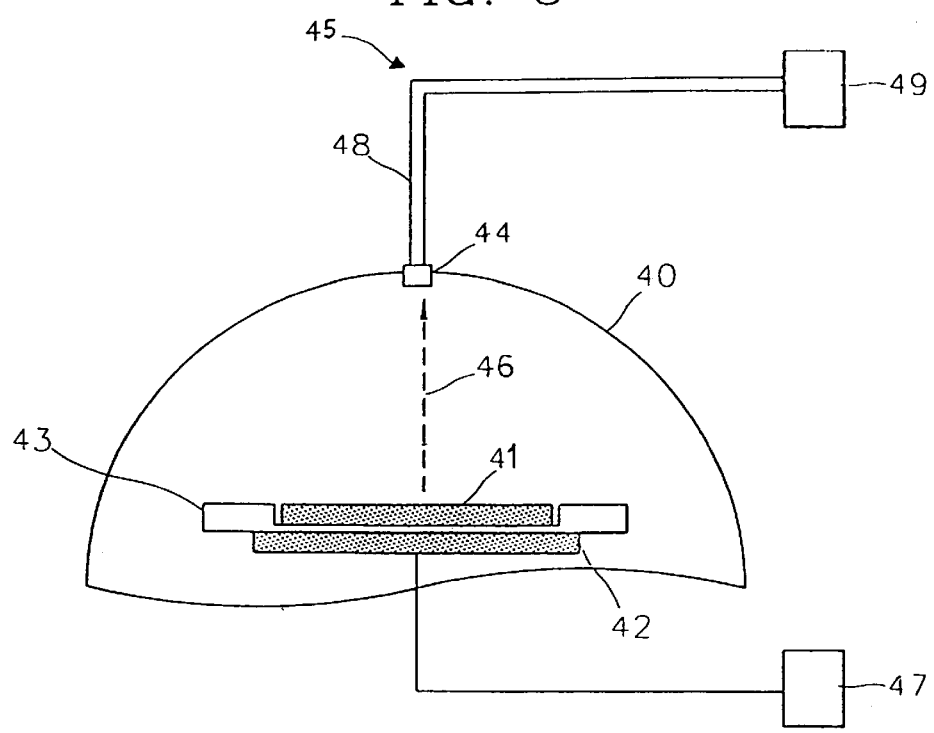
FIG. 3 is a schematic diagram of a reaction chamber including a heater temperature calibrating system according to the present invention.

FIG. 3 is a schematic diagram of a deposition system including a heater temperature calibrating system used to reduce variation in substrate temperatures during successive processing runs. More particularly, the calibrating system can be used to reduce variations in substrate temperatures when multiple processing runs are performed according to the present invention.

A method of forming a hemispherical grained silicon layer according to the present invention will now be discussed with reference to FIGS. 2 and 3. A semiconductor substrate 41 including the lower capacitor electrode 26 is placed on the susceptor 43 in the reaction chamber 40. The temperature of the substrate 41 is increased to the predetermined processing temperature using the heater 42 during a temperature ramp step.

During a temperature stabilizing step and a seeding step, a silicon source gas such as disilane ($Si_2H_6$) or silane ($SiH_4$) is injected into the reaction chamber 40. When the temperature of the substrate 41 is less than or equal to 500° C. during the temperature stabilization step, an amorphous layer is deposited on the lower capacitor electrode. When the temperature of the substrate 41 is greater than or equal to 500° C. during the seeding step, crystalline nuclei are formed. An irregular silicon layer (hemispherical grained seeding layer) is thus formed on the lower capacitor electrode during the seeding step. In addition, some silicon may be deposited on the inner wall of the reaction chamber while the silicon source gas is injected into the reaction chamber 40.

During the annealing step, the irregular silicon layer is annealed without injecting the source gas into the reaction chamber 40 thus forming a hemispherical grained silicon layer having a consistent profile. The seeding and annealing steps can thus be performed in a single reaction chamber. Moreover, the seeding and annealing steps can be performed one substrate at a time, or the seeding and annealing steps can be performed as a batch operation with multiple substrates.

As an increasing number of seeding and annealing steps are performed in the reaction chamber, an accumulation of silicon deposited on the inner wall may increase. The reflectivity of the reaction chamber walls may thus change thereby reducing the substrate temperature during subsequent processing runs. The lower substrate temperatures may alter the profile of the hemispherical grained silicon layer thus reducing the surface area of the lower capacitor electrode. The capacitance of a capacitor including the electrode thus formed may thus be reduced. It is therefore desirable to maintain a predetermined substrate temperature during each processing run despite the number of processing runs performed previously in the reaction chamber.

According to the methods of the present invention, desired substrate processing temperatures are maintained over a plurality of processing runs despite an increasing number of processing runs and resulting increased silicon buildup on the inner wall of the reaction chamber. As shown in FIG. 3, the methods of the present invention can be performed in a reaction chamber including a heater temperature calibrating system. In particular, the heater temperature calibrating system can be used to maintain desired substrate processing temperatures even if a number of processing runs between reaction chamber cleaning operations is increased. As shown, the heater temperature calibrating system can include a temperature sensor 45 and a heater thermostat 47.

A pyrometer is preferably used as the temperature sensor 45. As shown, the pyrometer can include a light receiving unit 44, a temperature sensor controller 49, and an optical cable 48. The temperature sensor controller converts a light signal from the light receiving unit 44 into a temperature value. A transmission line such as the optical cable 48 transmits the light signal between the temperature sensor 44 and the controller 49.

The light receiving unit 44 may be installed in the chamber 40 or on the wall of the chamber 40. This light receiving unit 44 detects the radiated energy 46 such as infrared rays from the substrate 41. The radiated energy is transmitted to the temperature sensor controller 49 through the optical cable 48. The substrate 41 may be a bare substrate, or the substrate 41 may be a substrate including lower electrode structures or other layers or structures formed thereon.

The temperature sensor controller 49 reads the wavelength of the radiated energy transmitted from the light receiving unit 44 and determines the substrate temperature from this radiated energy. The substrate temperature may be displayed on a monitoring unit such as a liquid crystal display (LCD). Alternately, a temperature calibration signal can be generated by comparing the measured wafer temperature with a calibration factor of the heater temperature and transmitted to the heater thermostat 47. Accordingly, the heater thermostat 47 can be controlled automatically using the temperature sensor controller of the present invention.

The heater thermostat 47 can control the heater temperature automatically by varying the current to the heater 42 as a function of the temperature calibration signal from the temperature sensor controller 49. Alternately, an operator can manually vary the heater thermostat 47 to control the heater temperature as a function of the substrate temperature and the calibration factor of the heater temperature. In either case, substrate processing temperatures can be maintained at a desired temperature from run to run even if a number of processing runs between chamber cleaning operations is increased. More particularly, the methods of the present invention can be used to reduce a lowering of the substrate process temperatures from run to run. The optical cable 48, temperature sensor controller 49, and the heater thermostat 47 may be located in the reaction chamber 40, or these elements may be located outside the chamber 40.

A method for maintaining a desired substrate process temperature from run to run will now be discussed in greater detail. A test substrate (or wafer) 41 is first loaded into the reaction chamber 40, and this test substrate 41 is used to measure a substrate temperature. The test substrate may be a bare substrate, or the test substrate may be a substrate on which a lower electrode or other layers or structures are formed. The heater 42 temperature is then increased according to the process recipe for forming the hemispherical grained silicon layer.

The temperature of the test substrate 41 is then measured using the temperature sensor 45. The test substrate temperature can be measured during any one of the steps illustrated in FIG. 2. Preferably, the substrate temperature is measured during the fourth annealing step. The calibration value of the heater temperature is then determined by comparing the measured substrate temperature with the calibration factor of the heater temperature. According to the calibration factor of the heater temperature, the heater temperature is either increased or decreased by varying the current to the heater 42. A desired substrate temperature can thus be maintained from processing run to processing run.

The calibration of the heater temperature may be performed while injecting a silicon source gas into the reaction chamber 40. The calibration of the heater temperature is preferably performed periodically. For example, the calibration of the heater temperature can be performed once every 24 hours, once every shift, or once every predetermined number of runs.

Figure 4:
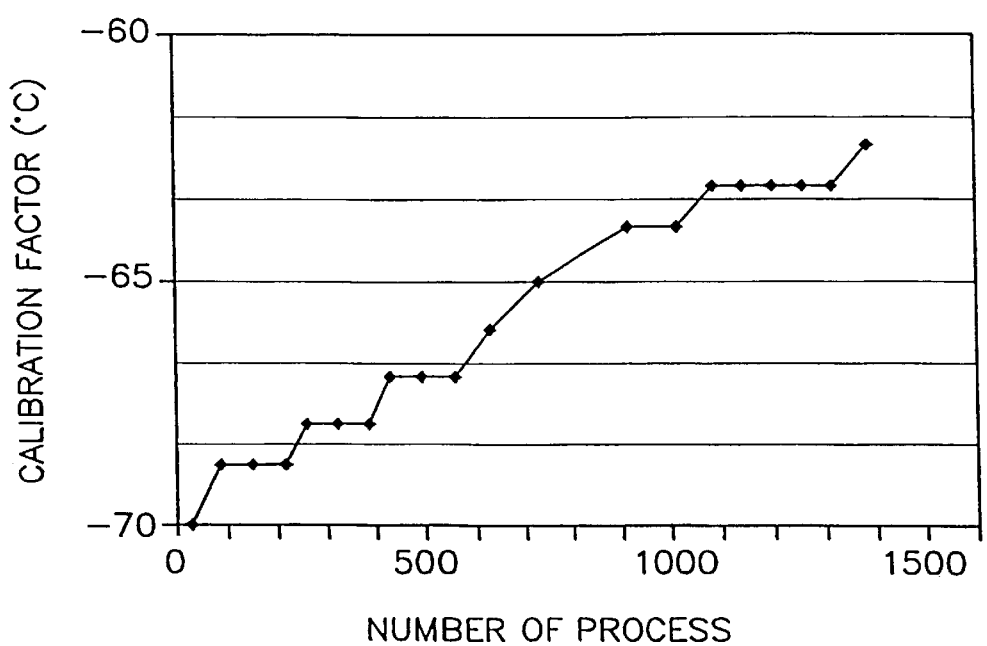
FIG. 4 is a graph illustrating a calibration factor of the heater temperature for the calibrating system of FIG. 3.

The calibration factor of the heater temperature will now be discussed with reference to FIGS. 4 and 5. FIG. 4 is a graph illustrating the calibration factor of the heater temperature wherein the abscissa indicates the performed number of processing runs used to form hemispherical grained silicon layers, and the ordinate indicates the calibration factor of the heater temperature. The calibration actor of the heater temperature is used to maintain predetermined substrate processing temperatures from processing run to processing run. In particular, the calibration factor can be used to reduce lowering of the substrate processing temperatures by changing the heater temperature without changing the process temperature as defined by the processing recipe. For example, if the processing temperature is 700° C. and the calibration factor of the heater temperature is −50° C., the actual temperature of the heater is 650° C.

As shown in FIG. 4, the absolute value for the calibration factor of the heater temperature decreases as the number of processing runs increases. In other words, the heater temperature should be increased to prevent the wafer temperature from being reduced as the performed number of processing runs increases. The value of the calibration factor of the heater temperature may vary depending on the equipment used to form the hemispherical grained silicon layers.

Figure 5:
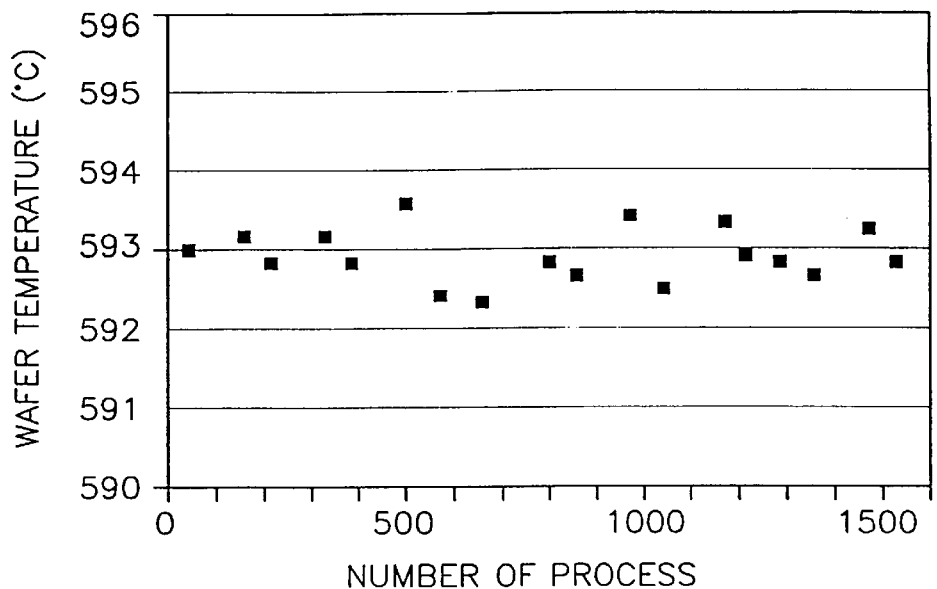
FIG. 5 is a graph illustrating the substrate temperature measured when controlling the heater temperature using the calibration factor according to the present invention.

FIG. 5 illustrates substrate temperatures measured when the heater temperature is adjusted according to the calibration factor wherein the abscissa indicates the performed number of processing runs used to form hemispherical grained silicon layers, and the ordinate indicates the substrate temperatures. It can thus be determined that the substrate temperatures are maintained in the range of about 592° C. to 594° C. even as the number of processing runs increases.

The substrate temperatures shown in FIG. 5 can be directly measured using the temperature sensor 45. Alternately, the wafer temperatures of FIG. 5 can be indirectly calculated using the equation;

$$DR = k \cdot exp(-E/RT)$$

Where DR is the deposition rate, T is the substrate temperature, E is the activation energy, R is a gas constant, and T is the absolute temperature. The substrate temperature can be indirectly obtained by substituting the deposition rate of the hemispherical grained silicon layer of the present invention. This deposition rate can be obtained by measuring the change in the thickness of the hemispherical grained silicon layer.

Figure 6:
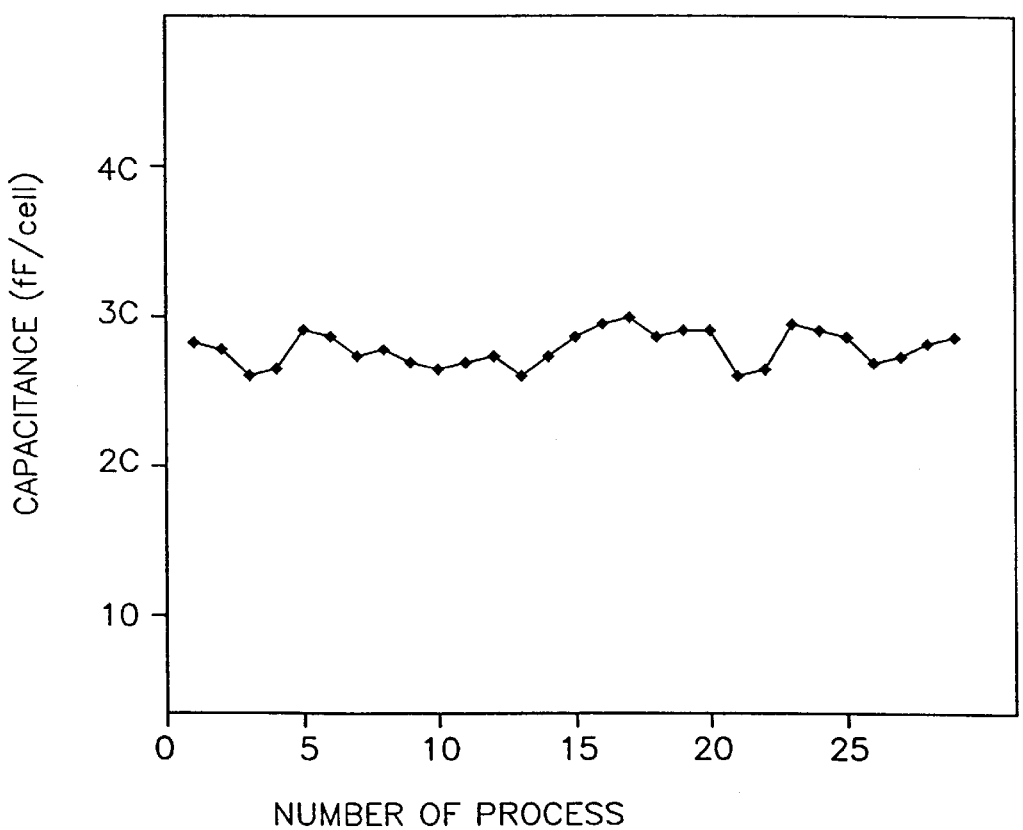
FIG. 6 is a graph illustrating the capacitance of a capacitor including a hemispherical grained silicon layer formed according to the present invention.

FIG. 6 is a graph illustrating the capacitance of a capacitor including a hemispherical grained silicon layer formed according to the present invention. The abscissa indicates the number of processing runs performed when forming hemispherical grained silicon layers, and the ordinate indicates the capacitance. As shown in FIG. 6, the capacitances of capacitors including hemispherical grained silicon layers formed according to the present invention is relatively constant. Moreover, the capacitance does not appear to be significantly affected by the number of processing runs performed.

As discussed above, the methods of the present invention can be used to maintain a desired wafer processing temperature despite a number of processing runs performed before cleaning the inner walls of the reaction chamber. More particularly, reductions in the wafer processing temperatures as the number of processing runs increases can be reduced. Accordingly, capacitors including hemispherical grained silicon layers formed according to the present invention can provide a relatively uniform capacitance. The reliability of integrated circuit devices including the hemispherical grained silicon layers can thus be increased.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a silicon layer having hemispherical grains thereon on a microelectronic substrate in a reaction chamber including a heater and using a process reaction recipe, said method comprising the steps of:

calibrating a heater temperature so that a process temperature is maintained when the microelectronic substrate is subsequently heated despite a number of processing runs previously performed, wherein said calibrating step comprises the steps of:

loading a test substrate into the reaction chamber, subjecting the test substrate to the process reaction recipe wherein the test substrate is heated according to the process reaction recipe, measuring the temperature of the test substrate while heating the test substrate according to the process reaction recipe, wherein the temperature of the test substrate is measured while a source gas including silicon is injected in to the reaction chamber according to the process reaction recipe;

removing the test substrate from the reaction chamber, and adjusting the heater temperature according to the measured temperature of the test substrate, wherein the heater temperature is adjusted by adjusting a current to the heater in response to a calibration value obtained by comparing the measured temperature of the test substrate with a calibration factor of the heater temperature;

after calibrating the heater temperature, loading the microelectronic substrate into the reaction chamber;

after loading the microelectronic substrate into the reaction chamber, forming a hemispherical grained silicon seed layer on the microelectronic substrate according to the process reaction recipe; and after forming the hemispherical grained silicon seed layer on the microelectronic substrate, annealing the hemispherical grained silicon seed layer to form a hemispherical grained silicon layer according to the process reaction recipe.

2. A method according to claim 1 wherein the temperature of the test substrate is measured using a pyrometer.

3. A method according to claim 1 wherein the test substrate is a bare semiconductor substrate.

4. A method of forming a silicon layer having hemispherical grains thereon on a microelectronic substrate in a reaction chamber including a heater and using a process reaction recipe, said method comprising the steps of:

calibrating a heater temperature so that a process temperature is maintained when the microelectronic substrate is subsequently heated despite a number of processing runs previously performed, wherein said calibrating step comprises the steps of:

loading a test substrate into the reaction chamber, wherein the test substrate includes a conductive electrode thereon, subjecting the test substrate to the process reaction recipe wherein the test substrate is heated according to the process reaction recipe, wherein the step of subjecting the test substrate to the process reaction recipe comprises exposing the test substrate to a silicon source gas, forming a hemispherical grained silicon layer on the conductive electrode during the calibration step, measuring the temperature of the test substrate while heating the test substrate according to the process reaction recipe, removing the test substrate from the reaction chamber, and adjusting the heater temperature according to the measured temperature of the test substrate;

after calibrating the heater temperature, loading the microelectronic substrate into the reaction chamber;

after loading the microelectronic substrate into the reaction chamber, forming a hemispherical grained silicon seed layer on the microelectronic substrate according to the process reaction recipe; and after forming the hemispherical grained silicon seed layer on the microelectronic substrate, annealing the hemispherical grained silicon seed layer to form a hemispherical grained silicon layer according to the process reaction recipe.

5. A method according to claim 1 wherein the calibration step is performed periodically.

* * * * *

UNITED STATES PATENT AND TRADEMARK OFFICE
CERTIFICATE OF CORRECTION

PATENT NO. : 6,117,692
DATED : September 12, 2000
INVENTOR(S) : Young-sun Kim et al.

Page 1 of 1

It is certified that error appears in the above-identified patent and that said Letters Patent is hereby corrected as shown below:

<u>Title page,</u>
Item [73], insert to read -- Samsung Electronics Co., Ltd, Republic of Korea --.

<u>Column 6,</u>
Line 12, please correct "actor" to read -- factor --.

Signed and Sealed this

Eighth Day of October, 2002

*Attest:*

*Attesting Officer*

JAMES E. ROGAN
*Director of the United States Patent and Trademark Office*